US006809544B2

(12) United States Patent
Liao et al.

(10) Patent No.: US 6,809,544 B2
(45) Date of Patent: Oct. 26, 2004

(54) TESTING DEVICE

(75) Inventors: Richard Liao, Hsinchu County (TW); Mao-Chi Hou, Chiai (TW); Hsin-Yu Lin, Pingjen (TW); Chen-Ping Wen, Taoyuan County (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 10/614,470

(22) Filed: Jul. 7, 2003

(65) Prior Publication Data

US 2004/0155673 A1 Aug. 12, 2004

(30) Foreign Application Priority Data

Feb. 7, 2003 (TW) ........................................ 92102608 A

(51) Int. Cl.[7] ................................................ G01R 31/00
(52) U.S. Cl. ..................... 324/770; 324/158.1; 324/755
(58) Field of Search ................................ 324/754–757, 324/765, 770, 158.1; 345/204, 904; 359/55, 57, 59

(56) References Cited

U.S. PATENT DOCUMENTS 5,546,013 A * 8/1996 Ichioka et al. .............. 324/770
6,150,833 A * 11/2000 Lin et al. .................... 324/770
6,603,467 B1 * 8/2003 Wu ............................ 345/204

* cited by examiner

*Primary Examiner*—Minh N. Tang
(74) *Attorney, Agent, or Firm*—Thomas, Kayden, Horstemeyer & Risley

(57) ABSTRACT

A device for testing liquid crystal display (LCD) prior to the installation of a drive chip is provided. The device at least includes a testing platform, a slope adjusting device, and a height adjusting device, wherein the slope adjusting device is used to adjust the slope of the testing platform while the height adjusting device is used to adjust the height of the testing platform. The testing platform is further equipped with rectangular fasteners with which the LCD can be fastened and a signal outputting device. The signal outputting device has a horizontal shifter which is fixed onto the testing platform, a vertical shifter which is coupled to the horizontal shifter, and a plurality of probes which are coupled to the vertical shifter, wherein the horizontal shifter and the vertical shifter can enable these probes to move along a plane perpendicular to the testing plane.

11 Claims, 3 Drawing Sheets

TESTING DEVICE

This application claims the benefit of Taiwan application Serial No. 092102608, filed Feb. 7, 2003.

BACKGROUND OF THE INVENTION

1. Field of the Invention

The invention relates in general to a testing device, and more particularly, to a device for testing liquid crystal display prior to the installation of a drive chip.

2. Description of the Related Art

With the advantageous features of low radiation, compactness and handiness, the liquid crystal display (LCD) has won great popularity in various fields of application. Prior to the installation of a drive chip, an LCD normally has to go through a simulated drive chip test using a signal outputting device whose plural probes output simulated drive chip signals to the LCD to inspect its performance of visual angles with an attempt to detecting the failed product as earlier as possible such that the manufacturing cost can be reduced.

During the testing procedures, the oblique angle test is usually needed. Fasten the target LCD (the LCD to be tested) to a sloping surfaced platform whose slope is fixed and cannot be changed using round-shaped fasteners; then the probes are driven and lowered to the voltage receiving area of the target LCD to perform testing.

The probes have vertical displacement only. Moreover, the space between the probes and the target LCD is very narrow and it is very difficult to place the target LCD into such a narrow space leading to a high likelihood of crashes. In addition, the load bearing between the round-shaped fasteners and the target LCD is heavy because the two elements only contact each other at points. Consequently, the wearing out of the fasteners and the occurrence of a cracked or fragmented LCD will increase. Moreover, when using a platform whose slope cannot be adjusted, an inspector has to make frequent movements during the process of testing, which is in fact an unnecessary waste of energy. Therefore, it is desired to improve the conventional testing platform.

SUMMARY OF THE INVENTION

It is therefore an object of the present invention to provide a labor saving testing device, which reduces the wearing out of elements.

The device for testing according to the present invention includes a testing platform, a height adjusting device, and a slope adjusting device. The height adjusting device is used to adjust the height of the testing platform while the slope adjusting device is used to adjust the slope of the testing platform. The height adjusting device includes a panel and a screw device wherein the above-ground height of the elements on the panel can be changed by adjusting the screw device. The slope adjusting device includes at least a screw rod and a brace wherein the brace is fixed onto the panel while the screw rod is coupled to the brace and to the rear of the testing platform. When screwed, the screw rod will perform relative movement against the brace and change the slope of the testing platform at the same time.

The testing platform includes a cavity, two signal outputting devices, and at least three fasteners. The cavity is used to accommodate the target LCD. The rectangular fasteners fasten the target LCD onto the cavity with most fasteners being situated at the downstream side of a tilting platform to bear the gravity imposed by the target LCD. Of the two outputting signal devices which are installed at a fastener-free side, one is horizontally arranged while the other is vertically arranged with the probe base facing the cavity.

The signal outputting device includes a probe base, a vertical shifter and a horizontal shifter wherein the probe base is equipped with a plurality of probe pieces and each probe piece is further equipped with plural probes. The horizontal shifter is fixed onto the testing platform and is coupled to the vertical shifter via a horizontal guide rail while the vertical shifter is coupled to the probe base via a vertical guide rail.

When the testing is completed, the probe base will be lifted first and only when a specific distance from the LCD has been reached will the vertical shifter start to withdraw backwards together with the probe base, creating an empty space above the LCD and the peripheral space thereof. At last, the target LCD, which has gone through the testing process, will be removed. On the other hand, when the next target LCD is to be tested, the vertical shifter will proceed forward until the probe base enters into the space above the target LCD. After that, the probe base starts to sink down until the probes reach the target LCD. The testing of the target LCD will start then.

Other objects, features, and advantages of the present invention will become apparent from the following detailed description of the preferred but non-limiting embodiments. The following description is made with reference to the accompanying drawings.

DETAILED DESCRIPTION OF THE INVENTION

Figure 1:
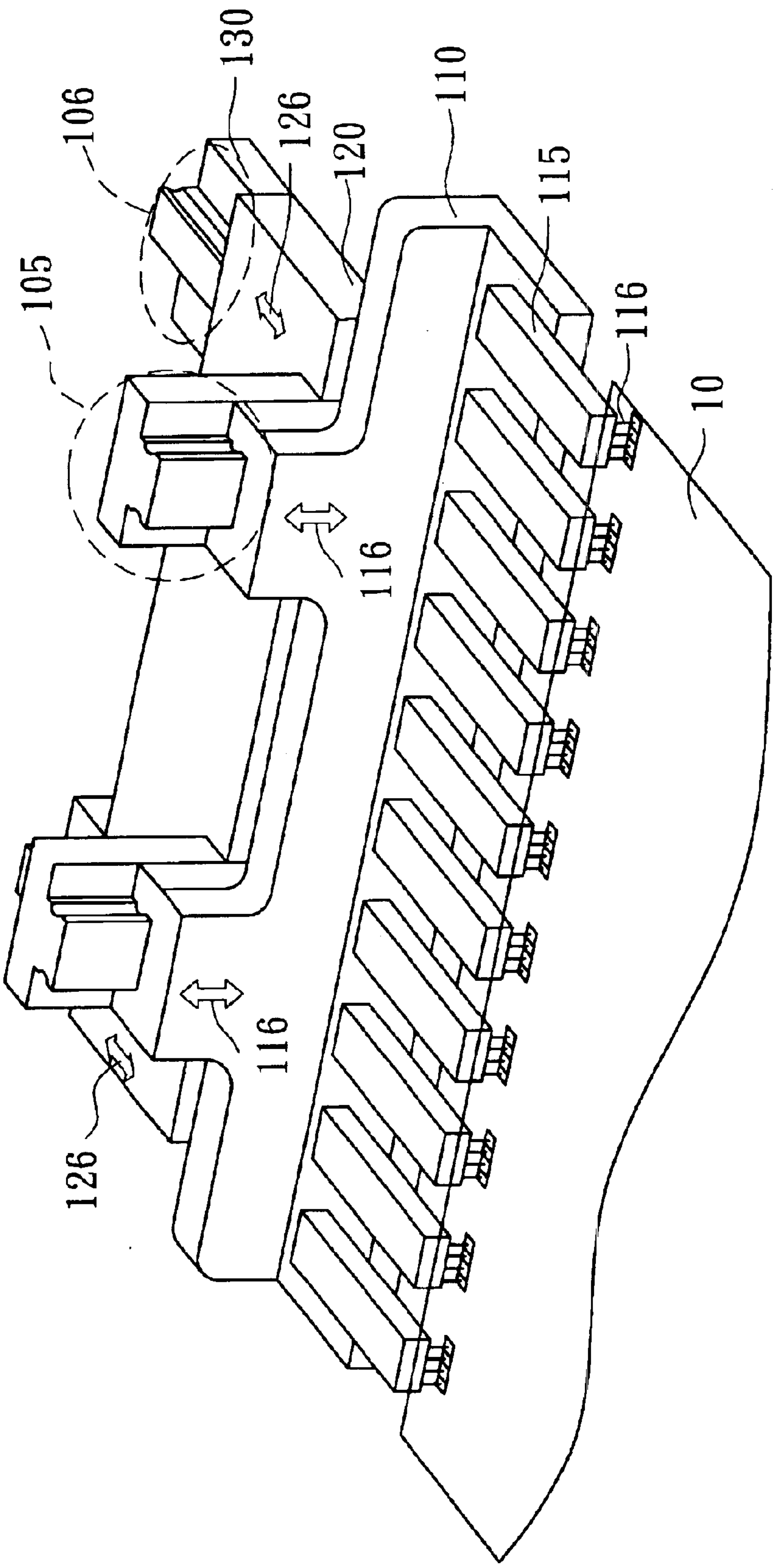
FIG. 1 is a three-dimensional diagram for a signal outputting device according to the present invention during the testing process.

Referring to FIG. 1, it is a three-dimensional diagram for a signal outputting device according to the present invention during the testing process. Signal outputting device 100 includes a probe base 110, a vertical shifter 120 and a horizontal shifter 130 wherein the probe base 110 is equipped with a plurality of probe pieces 115 and each of probe pieces 115 is further equipped with plural probes 116.

Figure 2:
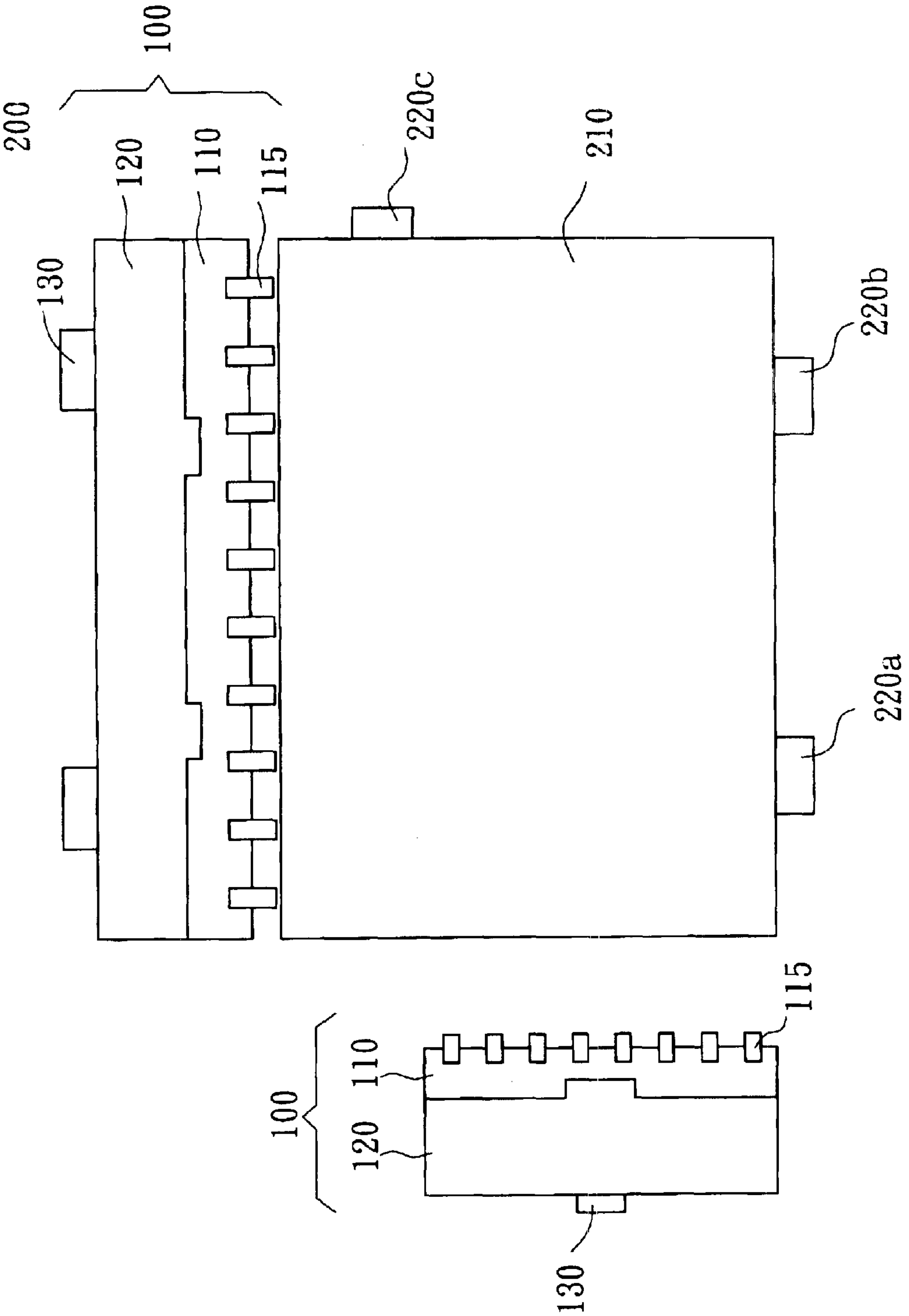
FIG. 2 is a bird's-eye view for a testing platform according to the present invention.

Horizontal shifter 130 is fixed onto testing platform 200 (as shown in FIG. 2) and is coupled to vertical shifter 120 via horizontal guide rail 106, while vertical shifter 120 is coupled to probe base 110 via a vertical guide rail 105. When the pressure cylinder (not shown) of the horizontal shifter 130 is started, vertical shifter 120 together with probe base 110 can move horizontally along horizontal guide rail 106 as arrow 126 shows. Similarly, when the pressure cylinder of vertical shifter 120 is started, probe base 110 can move vertically along vertical guide rail 105 as arrow 116 shows.

When the testing is completed, the pressure cylinder of vertical shifter 120 will be started first lifting probe base 10 upward until a specific distance from LCD 10 is reached. Next, start the pressure cylinder of horizontal shifter 130 to move vertical shifter 120 together with probe base 110 backwards until a specific distance has been reached to create an empty space above LCD 10 and the peripheral space thereof. Finally, remove the target LCD which has gone through the testing process.

When the next target LCD 10 is to be tested, the pressure cylinder of horizontal shifter 130 will be started first carrying vertical shifter 120 forward until probe base 110 enters into the space above target LCD 10. After that, start the pressure cylinder of vertical shifter 120 to lower probe base 110 downward until probes 116 touch target LCD 10. Then start to test LCD 10.

The probe base 110 according to the invention can perform two-stroke movement whose range is determined by the length of vertical guide rail 105 and that of horizontal guide rail 106. Nevertheless, the length can be adjusted according to the needs. The longer the length is, the larger the range allowed for the movement of probe base 110 will be. Meanwhile, the space for accommodating target LCD 10 will also be increased. The present invention is not limited to the structure shown in FIG. 1. Instead, any signal outputting device whose probes can move in two dimensions is applicable for the present invention.

Moreover, the signal outputting device 110 according to the present invention has all of its probes 116 installed in the same probe base 110 and has these probes synchronized in vertical movement and in horizontal movement as well, preventing probes 116 from outputting non-synchronous signals to target LCD 10, which will otherwise result in occurrences of errors during the testing process.

Referring to FIG. 2, it is a bird's-eye view for a testing platform according to the present invention. Testing platform 200 includes a cavity 210, two signal outputting devices 100 and at least three fasteners **220*a*, 220*b* and 220*c*. Cavity 210 is the place for accommodating target LCD 10. Of the two outputting signal devices 100 which are installed at a fastener-free side, one is horizontally arranged while the other is vertically arranged with the probe base 110 facing cavity 210, such that probes 116, by adjusting horizontal shifter 130 and vertical shifter 120 properly, can reach the signal receiving area of target LCD 10**.

After target LCD 10 has been placed at cavity 210, fasteners **220*a*, 220*b* and 220*c* will be used to fasten target LCD 10 onto cavity 210. Of which, the three fasteners 220*a*, 220*b* and 220*c* are situated at two lateral sides of cavity 210 with two fasteners 220*a* and 220*b* being situated at the downstream side of a tilting testing platform 200 to bear the gravity imposed by target LCD 10**.

As compared with the conventional design of round-shaped fasteners, fasteners **220*a*, 220*b* and 220*c* according to the present invention are rectangular, which contact target LCD 10 in a larger area reducing the load bearing per unit area and avoiding the wearing out of fasteners 220*a*, 220*b* and 220*c* as well as the occurrence of a cracked LCD 10**.

Figure 3:
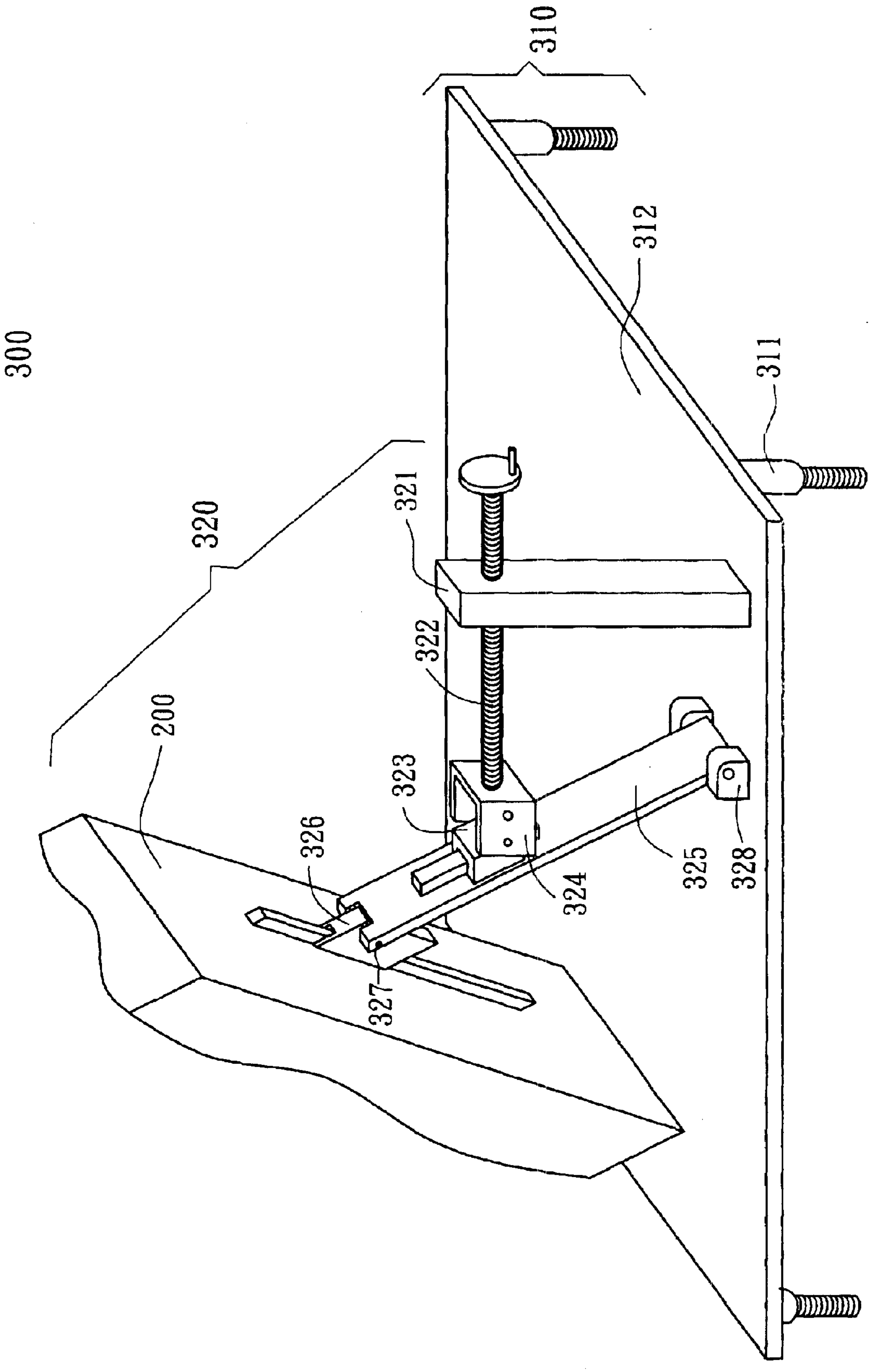
FIG. 3 is a three-dimensional diagram for the rear side of a testing device according to the present invention.

Referring to FIG. 3, it is a three-dimensional diagram for the rear side of a testing device according to the present invention. Testing device 300 includes a testing platform 200, a height adjusting device 310 and a slope adjusting device 320 wherein height adjusting device 310 is used to adjust the height of testing platform 200 while slope adjusting device 320 is used to adjust the slope of testing platform 200. Slope adjusting device 320 is coupled to the rear of testing platform 200 and to height adjusting device 310.

The height adjusting device 310 includes a screw device 311 and a panel 312 whose relative height to the ground can be changed by the adjusting screw device 311.

The slope adjusting device 320 includes a screw rod 322, a brace 321, a supporting plate 325, guide rails 323 and 326, pivot point 327, and pivot point devices 324 and 328. Brace 321 is fixed onto panel 312; screw rod 322 is coupled to brace 321 and is further coupled to guide rail 323 via pivot point device 324 while guide rail device 323 is situated on supporting plate 325 such that supporting plate 325 can have relative movement as well as relative rotation against screw rod 322. Supporting plate 325 is coupled to panel 312 via pivot point device 328 and to guide rail 326 via pivot point 327 while guide rail 326 is situated on the rear of testing platform 200 such that supporting plate 325 not only can have relative movement and relative rotation against testing platform 200 but also can have relative rotation against panel 312.

When screwed, screw rod 322 can have relative movement against brace 321. When screw rod 322 is screwed to the left, supporting plate 325 will move anti-clockwise using pivot point device 328 as the pivot point causing testing platform 200 to have a sharper slope. On the other hand, when screw rod 322 is screwed to the right, supporting plate 325 will move clockwise using pivot point device 328 as the pivot point causing testing platform 200 to have a flatter slope.

Therefore, the height of and the slope of the testing platform 200 according to the present invention can be adjusted to fit individual height of a tester and different visual angles of different products. Consequently, the tester does not need to move around frequently and the accuracy of testing can also be improved. Specifically, any testing platforms with adjustable slopes and heights are applicable for the present invention.

While the present invention has been described by way of example and in terms of a preferred embodiment, it is to be understood that the present invention is not limited thereto. Instead, it is intended to cover various modifications and similar arrangements, and the scope of the appended claims, therefore, should be accorded the broadest interpretation so as to encompass all such modifications and similar arrangements.

What is claimed is:

1. A device for testing a liquid crystal display (LCD) prior to the installation of a drive chip, comprising:

a testing platform;

a cavity situated on the surface of the testing platform for accommodating the LCD;

a rectangular fastener situated at one lateral side of the cavity and adapted to fasten the LCD onto the testing platform;

a signal outputting device situated at the lateral and fastener-free side of the cavity wherein the signal outputting device has a horizontal shifter which is fixed onto the testing platform, a vertical shifter which is coupled to the horizontal shifter, and plural probes coupled to the vertical shifter, of which, the horizontal shifter and the vertical shifter can enable these probes to move along a plane perpendicular to the testing platform and can enable these probes to contact with the LCD;

a slope adjusting device which is coupled to the rear of the testing platform and is used to adjust the slope of the testing platform; and a height adjusting device which is coupled to the slope adjusting device and is coupled to the testing platform, and is used to adjust the height of the testing platform.

2. The device according to claim 1, wherein the horizontal shifter has a horizontal guide rail facilitating the vertical shifter to make horizontal movements.

3. The device according to claim 1, wherein the vertical shifter has a vertical guide rail facilitating these probes to make vertical movements.

4. The device according to claim 2, wherein the horizontal shifter has a pressure cylinder used to control the horizontal movement of the vertical shifter.

5. The device according to claim 4, wherein the vertical shifter has a pressure cylinder used to control the horizontal movement of these probes.

6. The device according to claim 5, wherein when the testing is completed, the pressure cylinder of the vertical shifter will be started first enabling these probes to rise up vertically, next, start the pressure cylinder of the horizontal shifter to enable the vertical shifter together with these probes to move away from the space above the cavity horizontally.

7. The device according to claim 5, wherein after the LCD has been fastened at the cavity, the pressure cylinder of the horizontal shifter will be started first enabling the vertical shifter together with these probes to move towards the space above the cavity horizontally, next, start the cylinder of the vertical shifter to enable these probes to sink down vertically such that these probes can be positioned at the signal receiving area of the LCD.

8. The device according to claim 1, wherein the height adjusting device comprises a panel and at least three screw devices, wherein side one of the panel is coupled to the slope adjusting device and to a lateral side of the testing platform while side two of the panel is coupled to these screw devices, of which, the height of the panel and all elements thereon can be adjusted by adjusting these screw devices.

9. The device according to claim 8, wherein the slope adjusting device comprises a brace which is fixed onto the panel and a screw rod which is coupled to the brace and to the rear of the testing platform, of which, the slope of the testing device can be adjusted by adjusting the relative position between the screw rod and the brace.

10. The device according to claim 1, wherein most of the fasteners are situated at the downstream side of a tilting testing platform.

11. The device according to claim 1, wherein the longer sides of the fasteners are adjacent to the lateral sides of the cavity.

* * * * *